(12) United States Patent
Takahashi et al.

(10) Patent No.: US 7,545,127 B2
(45) Date of Patent: Jun. 9, 2009

(54) POWER SUPPLY CONTROLLER

(75) Inventors: Seiji Takahashi, Yokkaichi (JP); Masayuki Kato, Yokkaichi (JP); Masahiko Furuichi, Yokkaichi (JP); Isao Isshiki, Yokkaichi (JP)

(73) Assignees: Autonetworks Technologies, Ltd., Mie (JP); Sumitomo Wiring Systems, Ltd., Mie (JP); Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/084,209

(22) PCT Filed: Oct. 18, 2006

(86) PCT No.: PCT/JP2006/320774

§ 371 (c)(1),
(2), (4) Date: Apr. 28, 2008

(87) PCT Pub. No.: WO2007/052473

PCT Pub. Date: May 10, 2007

(65) Prior Publication Data
US 2008/0258787 A1    Oct. 23, 2008

(30) Foreign Application Priority Data
Oct. 31, 2005    (JP)    .............................. 2005-316836

(51) Int. Cl.
G05F 1/569    (2006.01)
(52) U.S. Cl. .................... 323/276; 323/277; 323/280
(58) Field of Classification Search ................ 323/274, 323/275, 276, 277, 279, 280, 315; 361/98
See application file for complete search history.

(56) References Cited

U.S. PATENT DOCUMENTS 5,559,423 A * 9/1996 Harman ...................... 323/277
5,585,994 A * 12/1996 Tamai et al. ................ 323/277

FOREIGN PATENT DOCUMENTS

| JP | A-05-168164 | 7/1993 |
| JP | A-05-319165 | 12/1993 |
| JP | A-08-204517 | 8/1996 |
| JP | A-11-041077 | 2/1999 |
| JP | A-11-097989 | 4/1999 |
| JP | A-2001-217696 | 8/2001 |
| JP | A-2003-188693 | 7/2003 |
| JP | A-2004-259582 | 9/2004 |

* cited by examiner

*Primary Examiner*—Jessica Han
(74) *Attorney, Agent, or Firm*—Oliff & Berridge, PLC

(57) ABSTRACT

A parallel circuit 27 of a frequency control circuit 11 is provided as an external circuit. Thereby, the charging time t1 depends on the characteristics of the circuit elements, which are provided in the package of a semiconductor device 70 and therefore subject to manufacturing variations of the semiconductor device 70. The discharging time t2 depends on the parallel circuit 27, which is provided external to the semiconductor device 70 and therefore can be selected to have appropriate characteristics after the semiconductor device 70 has been manufactured. The circuit constants of circuits are set so that the discharging time t2 that depends on the device characteristics of the external parallel circuit 27 is longer than the charging time t1 that depends on the device characteristics of the internal circuits of the semiconductor device 70.

11 Claims, 5 Drawing Sheets

POWER SUPPLY CONTROLLER

TECHNICAL FIELD

The present invention relates to a power supply controller for causing ON/OFF operation of a semiconductor switching element by PWM control.

BACKGROUND ART

Various nations have safety standards for vehicle headlamps, for example, which require that headlamps are on, even during a daytime drive, with an intensity of a predetermined ratio (e.g., 25%) to that during a night drive. In view of this, there has been proposed a daylight system for lighting headlamps during daytime by PWM control with an intensity of a predetermined ratio to that during nighttime. A construction for the PWM control is disclosed in Japanese Patent Laid-Open No. 2003-188693, for example. In the construction, based on the interterminal voltage of a capacitor that repeats charge and discharge, a triangular wave signal is provided for a hysteresis comparator. The hysteresis comparator compares in magnitude the level of the triangular wave signal with two threshold voltages provided therein, and outputs an output signal as a PWM signal according to level inversion of the magnitude relation.

However, there has been a problem that a PWM signal of a desired duty ratio cannot be generated with high accuracy due to the following reasons.

Specifically, in some cases, a PWM signal of a desired duty ratio cannot be generated with high accuracy due to manufacturing variations of a semiconductor device. Recently, a high-functional semiconductor device has been considered, in which an oscillator circuit for outputting a triangular wave signal and/or a comparator circuit (hysteresis comparator) are configured onto a semiconductor chip as a single chip or a plurality of chips housed in a package.

However, in the case that an oscillator circuit is provided in such a semiconductor device, there arises a problem that the elements of the oscillator circuit may have variation in characteristics. That is, a capacitor and/or a resistor which determine the oscillating frequency of the oscillator circuit is provided in the semiconductor device, and therefore the oscillating frequency may vary due to manufacturing variations thereof. Particularly in the case of vehicle daytime lighting described above, the headlamps may visibly flicker when the oscillating frequency is lower than a certain value (e.g., 40 Hz). Therefore, the oscillating frequency should be set with high accuracy to a frequency higher than the certain value.

Further, a threshold setting circuit (e.g., a voltage-dividing circuit) for setting the above threshold voltages can be also provided in the semiconductor device. In this case, the thresholds may vary due to manufacturing variations, and consequently the duty ratio cannot be set with high accuracy. Thus, the problem arises that high-accuracy PWM control cannot be achieved.

Moreover, in some cases, a PWM signal of a desired duty ratio cannot be generated with high accuracy due to voltage fluctuations in a power source that supplies power to the semiconductor device. That is, the power supply voltage may fluctuate when the vehicle engine is started, for example. Thereby, the two thresholds of the hysteresis comparator fluctuate, and therefore the duty ratio of the PWM signal fluctuates.

Thus, there is a need in the art for a power supply controller capable of generating a desired PWM signal with high accuracy.

A first aspect of the present invention provides a power supply controller disposed between a power source and a load for controlling power supply from the power source to the load. The power supply controller includes a semiconductor switching element disposed on a current supply line connected between the power source and the load, and further includes a PWM signal generator. The PWM signal generator includes an oscillator circuit for outputting an oscillator signal, and further includes a comparator circuit. The comparator circuit receives the oscillator signal and a reference signal, and outputs an output signal that is level-inverted according to a magnitude relation between a level of the oscillator signal and a level of the reference signal. The PWM signal generator is configured to provide an output signal of a pulse train from the comparator circuit, as a PWM signal for pulse width modulation control, to the semiconductor switching element in order to cause an ON/OFF operation. The oscillator circuit includes a parallel circuit, a first switching element, a charge/discharge control circuit, and a current changing circuit. The parallel circuit includes a first resistive element and a capacitor, which are arranged parallel to each other. The first switching element is disposed on the path of a charging current for charging the capacitor. The charge/discharge control circuit turns the first switching element from ON to OFF, when the charging voltage for the capacitor reaches a first voltage that changes depending on a power supply voltage of said power source. The charge/discharge control circuit turns the first switching element from OFF to ON, when the charging voltage is the same as a second voltage that changes depending on the power supply voltage. The current changing circuit changes the charging current depending on the power supply voltage.

According to this construction, a PWM signal of a predetermined duty ratio can be generated with immunity from fluctuation of the power supply voltage.

According to the present invention, preferably, the level of the reference signal, which is outputted from a reference signal setting circuit, changes depending on the power supply voltage. Thereby, the effect of fluctuation of the power supply voltage on the reference signal can be also suppressed.

Further, preferably, the reference signal setting circuit includes a second switching element, and a switching circuit that switches the level of the reference signal between a first level in the amplitude range of the oscillator signal and a second level out of the amplitude range of the oscillator signal based on an ON/OFF operation of the second switching element. Thereby, the PWM control can be readily switched between on and off by the ON/OFF operation of the second switching element.

Preferably, the current changing circuit includes a second resistive element connected to the power source, and further includes a current mirror circuit to which a current passing through the second resistive element passes. The capacitor is charged by a mirror current generated by the current mirror circuit.

Further, preferably, the circuits of the PWM signal generator except for the parallel circuit are configured onto a single chip or a plurality of chips housed in a package so as to form a semiconductor device, while the parallel circuit is disposed outside of the semiconductor device and connected to the circuits other than the parallel circuit via a first external terminal of the semiconductor device. The discharging time for the capacitor based on turn-off of the first switching element is preferably set to be longer than the charging time for the capacitor which is based on turn-on of the first switching element.

A second aspect of the present invention provides a power supply controller disposed between a power source and a load for controlling power supply from the power source to the load. The power supply controller includes a semiconductor switching element disposed on a current supply line connected between the power source and the load, and further includes a PWM signal generator. The PWM signal generator includes an oscillator circuit for outputting an oscillator signal, and further includes a comparator circuit. The comparator circuit receives the oscillator signal and a reference signal, and outputs an output signal that is level-inverted according to a magnitude relation between a level of the oscillator signal and a level of the reference signal. The PWM signal generator is configured to provide an output signal of a pulse train from the comparator circuit, as a PWM signal for pulse width modulation control, to the semiconductor switching element in order to cause an ON/OFF operation. The oscillator circuit includes a parallel circuit, a first switching element and a charge/discharge control circuit. The parallel circuit includes a first resistive element and a capacitor, which are arranged parallel to each other. The first switching element is disposed on the path of a charging current for charging the capacitor. The charge/discharge control circuit turns the first switching element from ON to OFF, when the charging voltage for the capacitor reaches a first voltage. The charge/discharge control circuit turns the first switching element from OFF to ON, when the charging voltage is the same as a second voltage. The oscillator circuit is configured to output an oscillator signal based on the charging voltage. The circuits of the PWM signal generator except for the parallel circuit are configured onto a single chip or a plurality of chips housed in a package so as to form a semiconductor device, while the parallel circuit is disposed outside of the semiconductor device and connected to the circuits other than the parallel circuit via a first external terminal of the semiconductor device. The discharging time for the capacitor based on turn-off of the first switching element is set to be longer than the charging time for the capacitor which is based on turn-on of the first switching element.

The semiconductor device may have variation (i.e., considerable variation resulting in double increase or decrease by half) in the resistance values of the resistive elements, or the like, constituting the semiconductor device due to manufacturing reasons. In view of this, according to the present construction, the circuits of the PWM signal generator except for the parallel circuit as a frequency determination element are provided in the semiconductor device, while the parallel circuit is provided external to the semiconductor device. Further, the discharging time, which depends upon the circuit constant of the parallel circuit provided external to the semiconductor device, is set to be longer than the charging time that is highly dependent on the characteristics of the circuit elements of the semiconductor device. That is, the charging time determined depending upon the internal circuits of the semiconductor device that may have manufacturing variation is set to be as short as possible so that the effect can be suppressed, while the discharging time determined depending upon the parallel circuit, which can be adjusted to have an appropriate circuit constant after the semiconductor device has been manufactured, is set to be longer. Thereby, the frequency can be set with high accuracy while suppressing the effect of manufacturing variation, if an external parallel circuit is selected to have characteristics appropriate for a desired frequency after the semiconductor device has been manufactured. Further, the oscillating frequency of a PWM signal can be set to an arbitrary value by adjusting the characteristics (circuit constant) of the parallel circuit.

According to the present invention, preferably, a reference signal setting circuit for outputting the reference signal is provided outside of the semiconductor device, and connected to the circuits other than the parallel circuit via a second external terminal of the semiconductor device. Thereby, the duty ratio can be set with high accuracy so as to be immune to manufacturing variations, if the components (e.g., a resistive element) of the reference signal setting circuit are selected to have characteristics appropriate for a desired duty ratio. Further, the duty ratio of a PWM signal can be set to an arbitrary value by adjusting the characteristics of the components.

Further, preferably, the semiconductor device includes a protective circuit for causing a shutoff operation of the semiconductor switch based on detection of an anomaly of a current passing through the semiconductor switch, and is configured onto a single chip or a plurality of chips housed in a package. A construction, in which a PWM signal generated based on software executed by a microcomputer is applied to a semiconductor switching element via a charge pump circuit in order to achieve ON/OFF control, is conventionally provided. However, a power supply controller is not necessarily mounted to a unit that includes a microcomputer. According to the present construction, the PWM signal generator (except for the parallel circuit and the reference signal setting circuit in some cases) is incorporated in the semiconductor device, and therefore PWM control for power supply can be achieved without a microcomputer.

1. General Construction of Power Supply Controller

Figure 1:
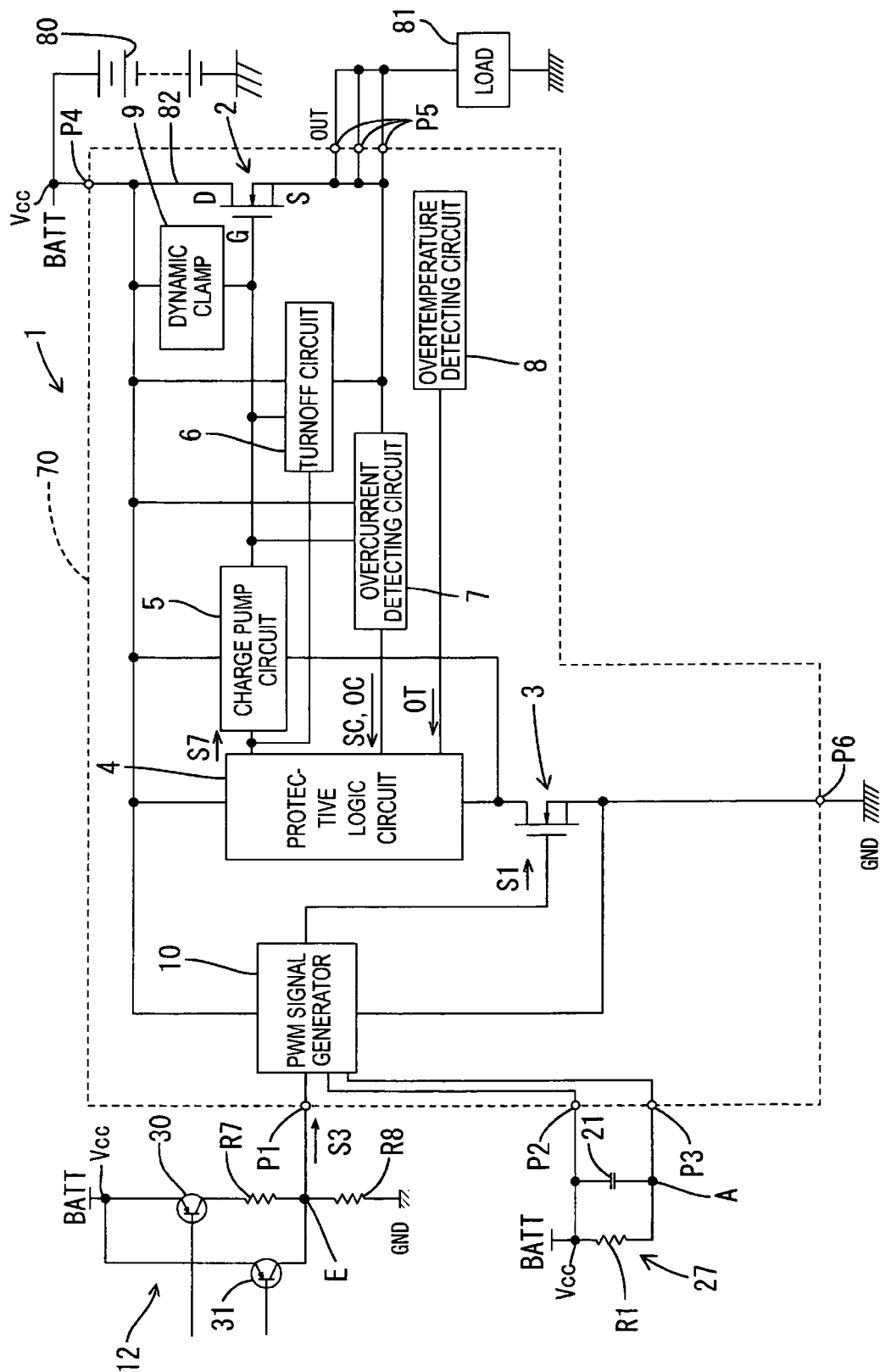
[FIG. 1] is a schematic diagram of a power supply controller according to an embodiment of the present invention.

FIG. 1 is a block diagram showing the general construction of a power supply controller 1 according to the present embodiment. As shown in the figure, the power supply controller 1 of the present embodiment includes a power MOSFET 2 (corresponding to "a semiconductor switching element" of the present invention) disposed on a current supply line 82 connected between a vehicle power source (hereinafter, referred to as "a power source 80") and a load 81, and further includes a PWM signal generator 10. The PWM signal generator 10 provides a PWM (Pulse Width Modulation) signal S1 directly or indirectly to the control input terminal (i.e., the gate terminal G) of the power MOSFET 2, so as to control the power supply from the power source 80, to the load 81 connected to the output side of the power MOSFET 2. In the present embodiment, the power supply controller 1 is installed on a vehicle not shown, and used for drive control for the load 81 such as a vehicle lamp, a cooling fan motor or a defogger heater. A switching circuit 12 described below is connected to an input terminal P1 of the power supply controller 1, which provides a PWM signal S1 for the power MOSFET 2 when a transistor 30 of the switching circuit 12 is turned ON.

As shown in FIG. 1, the PWM signal S1 from the PWM signal generator 10 is applied to the input of an FET 3. In response to the PWM signal S1, the FET 3 turns on so that a protective logic circuit 4 (i.e., an example of "a protective circuit" of the present invention) operates. A charge pump circuit 5 and a turnoff circuit 6 are connected to the protective logic circuit 4. Further, an overcurrent detecting circuit 7 and an overtemperature detecting circuit 8 are connected. A dynamic clamp 9 is connected between the drain terminal D and the gate terminal G of the power MOSFET 2.

The charge pump circuit 5 is connected to the gate terminal G of the power MOSFET 2. A line from the overcurrent detecting circuit 7 (i.e., specifically, a line from the gate terminal G of a sense MOSFET provided in the overcurrent detecting circuit 7, through which a sense current corresponding to the amount of a current of the power MOSFET 2 passes) is connected between the charge pump circuit 5 and the gate terminal G of the power MOSFET 2. The turnoff circuit 6 is connected between the gate terminal G and the source terminal S of the power MOSFET 2, and the protective logic circuit 4 controls the turnoff circuit 6.

The overcurrent detecting circuit 7 includes the sense MOSFET (not shown), through which a sense current corresponding to the amount of a current of the power MOSFET 2 passes. When the sense current exceeds a threshold provided for detecting a short anomaly in which a high current passes through the power MOSFET 2 due to short-circuiting of the load 81, for example, the overcurrent detecting circuit 7 outputs a first anomaly signal SC to the protective logic circuit 4. Further, when the sense current exceeds a threshold provided for detecting an overcurrent anomaly in which a high current (lower than that during a short anomaly) passes through the power MOSFET 2 due to some reason other than the short anomaly, for example, the overcurrent detecting circuit 7 outputs a second anomaly signal OC to the protective logic circuit 4.

The protective logic circuit 4 operates when it receives a PWM signal S1, so as to drive the charge pump circuit 5 during a normal state. The charge pump circuit 5 generates a higher voltage, which is applied between the gates and sources of the power MOSFET 2 and the sense MOSFET so that the power MOSFET 2 and the sense MOSFET turn ON resulting in a conductive state. On the other hand, when a first anomaly signal SC or a second anomaly signal OC is received, i.e., when a current anomaly is detected, the protective logic circuit 4 outputs a high-level control signal S7 so as to turn off the charge pump circuit 5 and drive the turnoff circuit 6. Thereby, the charge between the gate and source of each of the power MOSFET 2 and the sense MOSFET is released resulting in shutoff.

This shutoff operation may be a self-unrestorable shutoff operation, from which the conductive state will not be restored unless a PWM signal S1 (e.g. a load ON signal) is inputted again, or alternatively it may be a self-restorable shutoff operation, from which the power MOSFET 2 and the like are restored to the conductive state when neither a first anomaly signal SC nor a second anomaly signal OC is received.

A third anomaly signal OT, which is provided for indicating a temperature anomaly by the overtemperature detecting circuit 8, is also inputted to the protective logic circuit 4. In response to this, the protective logic circuit 4 outputs a control signal S7 so that the above-described self-restorable or self-unrestorable shutoff operation is performed for the power MOSFET 2 and the like.

2. Construction of PWM Signal Generator

The PWM signal generator 10 generates and provides a PWM signal S1 of a desired duty ratio for a semiconductor device (semiconducting device) 70 (e.g., in the present embodiment, a semiconductor device incorporating the power MOSFET 2 and a protective function therefor (e.g., an IPD: intelligent power device)) in order to achieve ON/OFF operation. Thereby, the PWM signal generator 10 performs PWM (Pulse Width Modulation) control for power supply from the power source 80 to the load 81 connected to the output side of the semiconductor device 70 (the power MOSFET 2).

Hereinafter, the PWM signal generator 10 will be explained with reference to FIGS. 2 and 3.

Figure 2:
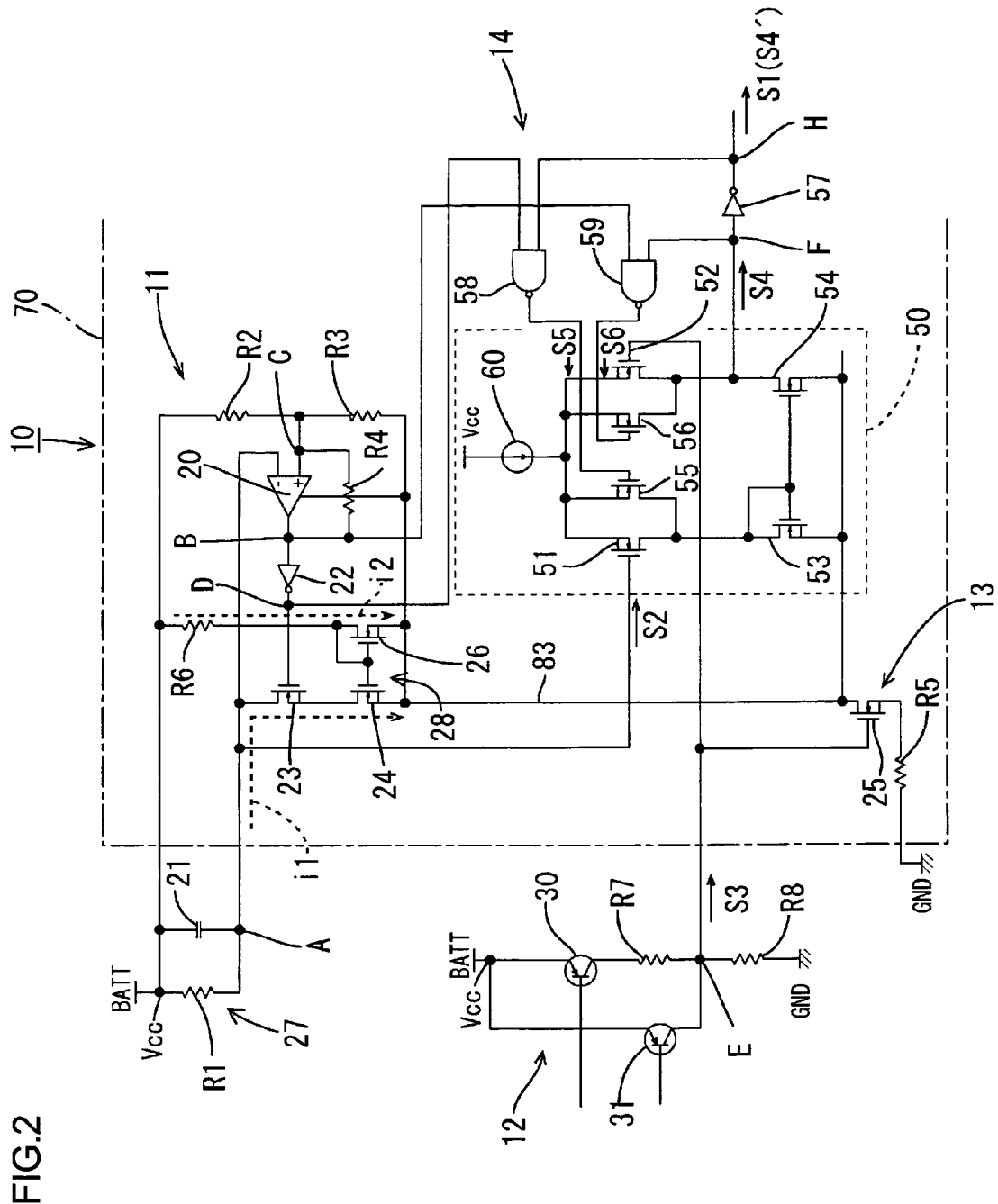
[FIG. 2] is a schematic diagram of a PWM signal generator.

FIG. 2 is a schematic diagram of the PWM signal generator 10 according to the present embodiment. As shown in the figure, the PWM signal generator 10 mainly includes a frequency control circuit 11 for outputting an oscillator signal S2, a switching circuit 12 for switching between daytime lighting and nighttime lighting or the like as described below, a leakage current cutoff circuit 13 and a duty ratio control circuit 14.

(1) Frequency Control Circuit

The frequency control circuit 11 (i.e., an example of "an oscillator circuit" of the present invention) includes a comparator 20 (or alternatively an operational amplifier). The negative input terminal of the comparator 20 is connected to the higher potential terminal P4 (the higher potential is Vcc and an example of "a power supply voltage" of the present invention) of the power source 80 via a parallel circuit 27 of a capacitor 21 and a first resistor R1 (i.e., an example of "a first resistive element" of the present invention). That is, a voltage signal of a level corresponding to the interterminal voltage of the capacitor 21 is applied to the negative input terminal of the comparator 20. Hereinafter, a voltage level at point "A" connected to the negative input terminal of the comparator 20 is referred to as "Va". Note that a signal corresponding to the voltage level Va at point "A" is provided as an oscillator signal S2 for the duty ratio control circuit 14. The potential difference between the power supply voltage Vcc and the voltage Va corresponds to the interterminal voltage of the capacitor 21, and is an example of "a charging voltage for a capacitor" of the present invention.

On the other hand, a divided potential of a voltage-dividing circuit, which includes voltage-dividing resistors R2 and R3 serially connected between the higher potential terminal P4 and the lower potential(GND) terminal P6 of the power source 80, is applied to the positive input terminal of the comparator 20. Further the output B of the comparator 20 is fed back to the positive input terminal via a feedback resistor R4. That is, a voltage signal of a level depending on the resistance values of the voltage-dividing resistors R2, R3 and the feedback resistor R4 is applied to the positive input terminal of the comparator 20. Hereinafter, a voltage level at point "C" connected to the positive input terminal of the comparator 20 is referred to as "Vc".

The output of the comparator 20 is provided forward to a NOT circuit 22. On the other hand, the lower potential side of the parallel circuit 27 is connected to the lower potential terminal P6 side of the power source 80 via serially connected three n-channel FETs 23, 24, 25 and a resistor R5. A voltage signal corresponding to the output D of the NOT circuit 22 is applied to the gate of the higher-potential-side FET 23 of the FETs. The FET 23 is an example of "a first switching element" of the present invention. The line 83 connected between the parallel circuit 27 and the lower potential terminal P6 is an example of "a path of a charging current" of the present invention, on which the FETs 23-25 and the resistor R5 are arranged. The comparator 20, the resistors R2-R4 and the NOT circuit 22 correspond to an example of "a charge/discharge control circuit" of the present invention.

The FET 24 forms a current mirror circuit 28 together with an n-channel FET 26. The gate and drain of the FET 26 are short connected, and the drain is connected to the higher potential terminal P4 of the power source 80 via a second resistor R6 (corresponding to "a second resistive element" of the present invention). The current mirror circuit 28 and the second resistor R6 correspond to an example of "a current changing circuit" of the present invention.

(2) Switching Circuit and Leakage Current Cutoff Circuit

The switching circuit 12 includes a pair of PNP transistors 30, 31. The emitter of the transistor 30 is connected to the higher potential terminal P4 side of the power source 80, while the collector is connected to the lower potential terminal P6 side of the power source 80 via a pair of voltage-dividing resistors R7, R8. The emitter of the transistor 31 is connected to the higher potential terminal P4 side of the power source 80, while the collector is connected to the connecting point E between the voltage-dividing resistors R7, R8. A signal corresponding to the voltage level Ve at the connecting point E is provided as a reference signal S3 for the duty ratio control circuit 14. The signal corresponding to the voltage level Ve at the connecting point E is also provided to the gate of the FET 25.

The transistor 31 turns on, when a signal for instruction of "nighttime lighting", e.g., lighting of headlamps with a duty ratio of 100%, is received from an operating portion not shown of the vehicle. The transistor 30 turns on, when a signal for instruction of "daytime lighting (daylight)", e.g., lighting of headlamps with a duty ratio of 25% (i.e., an example of "a desired duty ratio" of the present invention), is received. The FET 25 turns on when one of the transistors 30, 31 is on, and turns off when both of the transistors 30, 31 are off. That is, when the headlamps are in a state such as an OFF state other than nighttime lighting or daytime lighting, the FET 25 turns off so as to provide a function for preventing a leakage current.

(3) Duty Ratio Control Circuit

The duty ratio control circuit 14 includes a comparator 50 (i.e., an example of "a comparator circuit" of the present invention). The comparator 50 includes a first FET 51 of p-channel type as a current control element which is connected to the positive input terminal thereof and switches between on and off in response to the oscillator signal S2, and further includes a second FET 52 of p-channel type as a current control element which is connected to the negative input terminal thereof and switches between on and off in response to the reference signal S3.

The source of the first FET 51 is connected to a constant current source 60, while the drain is connected to the connecting point between the FET 24 and the FET 25 via an n-channel FET 53. On the other hand, the source of the second FET 52 is also connected to the constant current source 60, while the drain is connected to the connecting point between the FET 24 and the FET 25 via an n-channel FET 54. The FET 53, of which gate and drain are short connected, forms a current mirror circuit together with the FET 54.

An output signal S4, which is level-inverted according to a magnitude relation between the levels of the oscillator signal S2 and the reference signal S3, is provided to a NOT circuit 57. The NOT circuit 57 outputs a level-inverted output signal S4' as a PWM signal S1. Hereinafter, a voltage level at the output point F of the comparator 50 is referred to as "Vf", while a voltage level at the output point H of the NOT circuit 57 is referred to as "Vh".

In the present embodiment, a first shorting FET 55 of p-channel type as a shorting switching element is connected in parallel to the first FET 51. The first shorting FET 55 turns on when a control signal S5 of low level is received on the gate thereof, so as to provide a function for forming short connection between the source and drain of the first FET 51. Further, a second shorting FET 56 of p-channel type as a shorting switching element is connected in parallel to the second FET 52. The second shorting FET 56 turns on when a control signal S6 of low level is received on the gate thereof, so as to provide a function for forming short connection between the source and drain of the second FET 52.

The PWM signal generator 10 includes a pair of NAND circuits 58, 59. A voltage level Vd at the output D of the NOT circuit 22 and a voltage level Vh at the output point H of the NOT circuit 57 are applied to the inputs of the NAND circuit 58. The output thereof is applied to the gate of the first shorting FET 55. On the other hand, a voltage level Vb at the output point B of the comparator 20 and a voltage level Vf at the input point F of the NOT circuit 57 are applied to the inputs of the NAND circuit 59. The output thereof is applied to the gate of the second shorting FET 56.

This is the end of the circuit construction of the PWM signal generator 10. Note that, in the present embodiment, the power MOSFET 2, the FET 3, the protective logic circuit 4, the charge pump circuit 5, the turnoff circuit 6, the overcurrent detecting circuit 7, the overtemperature detecting circuit 8 and the dynamic clamp 9 are configured onto a single chip or a plurality of chips housed in a package, which constitutes the semiconductor device 70. Further, the other circuits are configured onto a single chip of the semiconductor device 70 or a plurality of chips housed in a package, except for the capacitor 21 and the first resistor R1, (i.e., the parallel circuit 27) provided for determining the oscillating frequency of the frequency control circuit 11, and the switching circuit 12. More specifically, one terminal side of the RC parallel circuit 27 is connected to the higher potential sides of the resistors R2, R6 via an external terminal P2 (i.e., an example of "a first external terminal" of the present invention), while the other terminal side thereof is connected to the negative input terminal of the comparator 20 via an external terminal P3 (i.e., an example of "a first external terminal" of the present invention). The connecting point E between the voltage-dividing resistors R7, R8 of the switching circuit 12 is connected to the gate of the FET 25 and the duty ratio control circuit 14 via an external terminal P1 (i.e., an example of "a second external terminal" of the present invention).

3. Operation of the present embodiment (1) Frequency Control Circuit

When power from the power source 80 is applied to the power supply controller 1 and a nightlight signal or a daylight signal is inputted to the switching circuit 12, the FET 25 turns on. At the beginning, point "A" connected to the negative input terminal of the comparator 20 is on the side of the higher potential terminal voltage Vcc of the power source 80, and the comparator 20 is off, that is, the voltage Vb at the output point B of the comparator 20 is low level. Therefore, the FET 23 turns on in response to a voltage signal Vd of high level from the NOT circuit 22. Thereby a charging current i1 (i.e., an example of "a mirror current" of the present invention) passes from the power source 80 through the parallel circuit 27, the FETs 23, 24, 25 and the resistor R5, and charging of the capacitor 21 begins.

The FETs 24, 26 form a current mirror circuit 28 as described above. Therefore the amount of a charging current i1 passing through the FETs 23, 24 depends on the amount of a current i2 (corresponding to "a current passing through a second resistive element" of the present invention) passing through the second resistor R6 and the FET 26, that is, depends on the higher potential Vcc of the power source 80. If the higher potential Vcc of the power source 80 decreases due to fluctuation of the power supply voltage or the like, the amount of the charging current i1 for the capacitor 21 decreases accordingly. Conversely, when the higher potential Vcc of the power source 80 increases, the amount of the charging current i1 for the capacitor 21 increases accordingly. As a result, the charging time for the capacitor 21, i.e., the frequency of the oscillator signal S2 at point "A", can be stable with immunity from fluctuation of the higher potential Vcc of the power source 80. This will be described in detail later.

At the time, the voltage level Vb at the output point B of the comparator 20 is almost equal to the lower potential GND of the power source 80. In the present embodiment, the resistance values of the voltage-dividing resistors R2, R3 are equal to each other, and the resistance value of the feedback resistor R4 is set to a half of that of the voltage-dividing resistor R2 (or R3), for example. Therefore, as shown in (the uppermost field of the timing chart of) FIG. 3, the voltage level Vc at point "C" is equal to ¼Vcc, which is applied to the positive input terminal of the comparator 20. At this time, the charging voltage for the capacitor 21 is equal to ¾Vcc(=(the higher potential Vcc)−(the above ¼Vcc)), which is an example of "a first voltage" of the present invention.

Thereafter the voltage level Va at point "A" gradually decreases as the charging of the capacitor 21 proceeds. When the voltage level falls below ¼Vcc, the voltage level Vb at the output point B of the comparator 20 is level-inverted to a high level (See the figure (the second field from the top in the timing chart)). This causes the FET 23 to turn off, so that the charging of the capacitor 21 suspends and discharging begins. At this time, the voltage level Vb at the output point B of the comparator 20 is almost equal to the higher potential Vcc of the power source 80. Therefore, as shown in (the uppermost field of the timing chart of) FIG. 3, the voltage level Vc at point "C" is equal to ¾Vcc, which is applied to the positive input terminal of the comparator 20. At this time, the charging voltage for the capacitor 21 is equal to ¼Vcc (=(the higher potential Vcc)−(the above ¾Vcc)), which is an example of "a second voltage" of the present invention.

Thereafter the voltage level Va at point "A" gradually increases as the discharging of the capacitor 21 proceeds. When the voltage level exceeds ¾Vcc, the comparator 20 returns off (See the figure (the second field from the top in the timing chart)) and thereby the voltage level Vb at the output point B is level-inverted to a low level. Thus the voltage level Va at the point A is level-inverted between ¼Vcc and ¾Vcc so as to vary in triangular wave pattern, which is applied as an oscillator signal S2 to the positive input terminal (i.e., the gate of the first FET 51) of the comparator 50 of the duty ratio control circuit 14.

(2) Duty Ratio Control Circuit

In the duty ratio control circuit 14, the oscillator signal S2 from the frequency control circuit 11 is inputted to the positive input terminal of the comparator 50, while the voltage level Ve at the connecting point E is provided to the negative input terminal thereof from the switching circuit 12. In the present embodiment, the resistance values of the resistors R7, R8 are set, so that the voltage level Ve at the connecting point E when the switching circuit 12 receives a daylight signal is adjusted to a level (between ¼Vcc and ¾Vcc, but closer to ¼Vcc) shown in (the uppermost field of the timing chart of) FIG. 3. (The voltage level Ve at this time is an example of "a first level" of the present invention.) More specifically, that is adjusted so that the duty ratio of the PWM signal S1 is 25%, for example.

When the level of the oscillator signal S2 exceeds the voltage level Ve of the connecting point E, the first FET 51 of the comparator 50 is off, and the voltage level Vf at the output point F of the comparator 50 is high level. On the other hand, when the level of the oscillator signal S2 falls below the voltage level Ve of the connecting point E, the first FET 51 turns on, and the voltage level Vf at the output point F of the comparator 50 is level-inverted to a low level. Thereby, the voltage level Vf at the output point F of the comparator 50 pulses in rectangular wave pattern as shown in FIG. 3 (i.e., in the fourth field from the top in the timing chart).

However, the level of the reference signal S3 (i.e., the voltage level Ve at the connection E) from the switching circuit 12 may fluctuate due to a noise or the like during vehicle acceleration or deceleration, for example. In this case, chattering will occur at the time of level inversion between the level of the oscillator signal S2 and the level of the reference signal S3 (See FIG. 3 (the fourth and fifth fields from the top in the timing chart)). Thereby the duty ratio of the PWM signal S1 will fluctuate, and the stable PWM control for daytime lighting may not be provided.

For this reason, according to the present embodiment, the first and second shorting FETs 55, 56 are provided in the comparator 50 as described above. The first shorting FET 55 turns on, when a low-level signal, which is outputted when the voltage level Vd at the output D of the NOT circuit 22 and the voltage level Vh at the output point H of the NOT circuit 57 are both high level, is received from the NAND circuit 58. Otherwise a high-level signal is received, and therefore the first shorting FET 55 is off. That is, the first shorting FET 55 is on (i.e., performing a shorting operation) until the changing trend of the oscillator signal S2 is inverted (i.e., inverted from a downward trend to an upward trend) after the level of the oscillator signal S2 falls below the level of the reference signal S3, as shown in FIG. 3 (i.e., in the sixth field from the top in the timing chart). Otherwise the first shorting FET 55 is off (i.e., in a non-shorting state).

According to this construction, the first shorting FET 55 short-connects between the drain and source of the first FET 51 disposed on the positive input terminal side, when the level of the oscillator signal S2 falls below the level of the reference signal S3. Thereby a higher current passes through the FET 54, which forms a current mirror circuit together with the FET 53 connected to the first FET 51. Therefore, in this case, the voltage level Vf at the output point F of the comparator 50 is forcibly maintained at a low level, even if the level of the reference signal S3 fluctuates. Thus level-inversion can be inhibited. The capacitor 21 is being charged at this time. Therefore the voltage level Va at point "A" is decreasing, and a current passing through the first FET 51 is increasing. The current passing through the first FET 51 (i.e., a current corresponding to the level of the oscillator signal S2) also passes through the FETs 53, 54. When the first shorting FET 55 is turned on, a current, higher than the current passing through the first FET 51 when the first shorting FET 55 is off, passes through the FETs 53, 54. This means that a level to be compared with the level of the reference signal S3 by the comparator 50 is changed irrespective of the level of the oscillator signal S2 so that the voltage level Vf at the output point F is not level-inverted.

On the other hand, the second shorting FET 56 turns on, when a low-level signal, which is outputted when the voltage level Vb at the output point B of the comparator 20 and the voltage level Vf at the input point F of the NOT circuit 57 are both high level, is received from the NAND circuit 59. Otherwise a high-level signal is received, and therefore the second shorting FET 56 is off. That is, the second shorting FET 56 is on (i.e., performing a shorting operation) until the changing trend of the oscillator signal S2 is inverted (i.e., inverted from an upward trend to a downward trend) after the level of the oscillator signal S2 exceeds the level of the reference signal S3, as shown in FIG. 3 (i.e., in the seventh field from the top in the timing chart). Otherwise the second shorting FET 56 is off (i.e., in a non-shorting state).

Thus the second shorting FET 56 short-connects between the drain and source of the second FET 52 disposed on the negative input terminal side, when the level of the oscillator signal S2 exceeds the level of the reference signal S3. Therefore, in this case, the voltage level Vf at the output point F of the comparator 50 is forcibly maintained at a high level, even if the level of the reference signal S3 fluctuates. Thus level-inversion is inhibited. The capacitor 21 is being discharged at this time. Therefore the voltage level Va at point "A" is increasing, and a current passing through the first FET 51 is decreasing. On the other hand, a current corresponding to the level of the reference signal S3 passes through the second FET 52. When the second shorting FET 56 turns on, a current, higher than the current passing through the second FET 52 when the second shorting FET 56 is off, passes through the second shorting FET 56. This means that a level to be compared with the level of the oscillator signal S2 by the comparator 50 is changed irrespective of the level of the reference signal S3 so that the voltage level Vf at the output point F is not level-inverted.

(3) Switching Circuit and Leakage Current Cutoff Circuit

The operation during daytime lighting has been explained above. In the case of switching to nighttime lighting, a nightlight signal is provided for the switching circuit 12. Thereby the transistor 30 turns off, and the transistor 31 turns on. Then the level of the reference signal S3 (i.e., the voltage level Ve at the connection E) becomes almost equal to the higher potential Vcc of the power source 80, as shown in the right side of (the uppermost field of the timing chart of) FIG. 3. (The voltage level Ve at this time is an example of "a second level" of the present invention.) Therefore the level of the reference signal S3 continuously exceeds the level of the oscillator signal S2. Thereby, nighttime lighting is performed with a duty ratio of 100%.

In the case that lighting of headlamps is not required, the transistors 30, 31 of the switching circuit 12 are both turned off. Then the FET 25 also turns off, and thereby a leakage current from the power source 80 can be cut off during an OFF state.

According to the present embodiment, switching between nighttime lighting and daytime lighting of headlamps, and leakage current cutoff during an OFF state of headlamps are thus achieved by switching control using the switching circuit 12.

Figure 4:
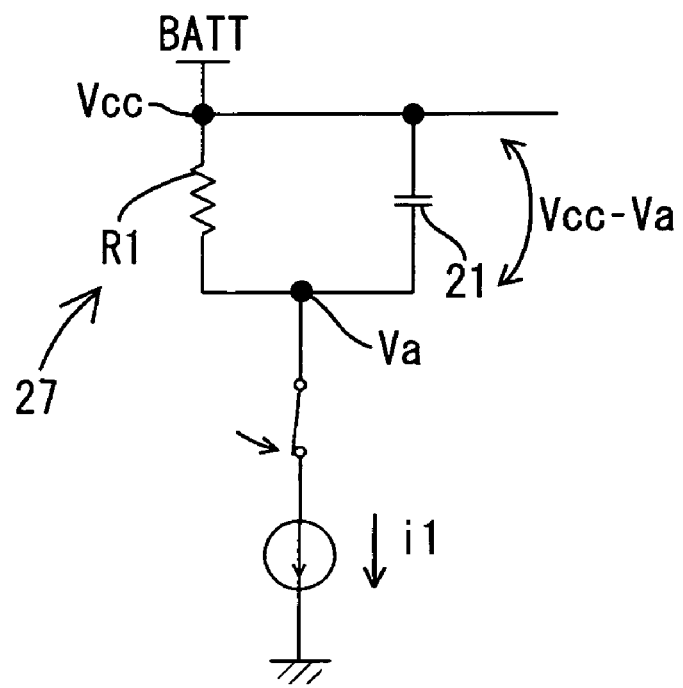
[FIG. 4] is an equivalent circuit diagram of a parallel circuit during charging.
Figure 5:
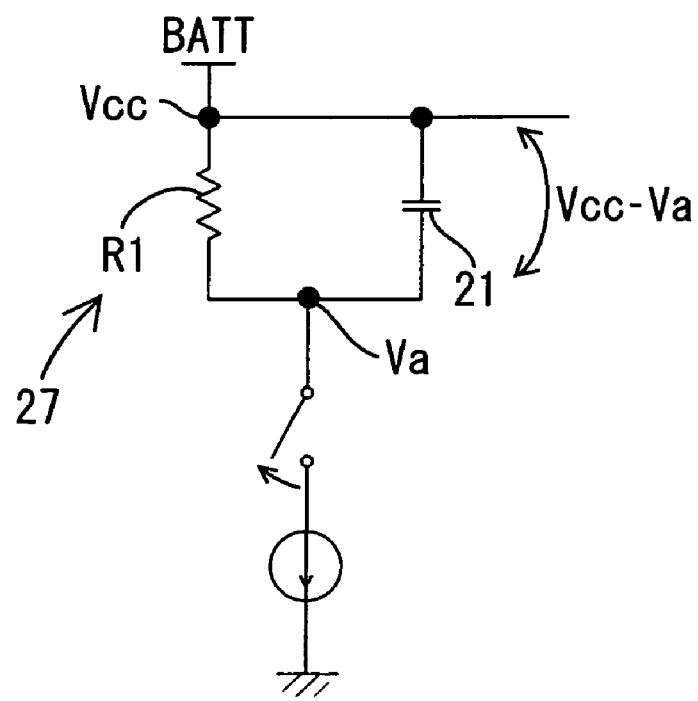
[FIG. 5] is an equivalent circuit diagram of the parallel circuit during discharging.

4. Effects of the Present Embodiment (1) Effect on Fluctuation of the Power Supply Voltage FIG. 4 shows an equivalent circuit when the comparator 20 is off and therefore the capacitor 21 is being charged. FIG. 5 shows an equivalent circuit when the comparator 20 is on and therefore the capacitor 21 is being discharged.

As seen in FIG. 4, the relationship of the voltage level Va at point "A" to time t during charging of the capacitor 21 can be expressed by the following mathematical formula 1:

$$Vcc - Va = R \cdot i1 + k \cdot e^{-\frac{1}{CR}t} \qquad \text{(Formula 1)}$$

where R is the resistance value of the first resistor R1, C is the capacitance of the capacitor 21, and k is a coefficient determined based on Formula 1 when time t=0 and Va=¾Vcc.

Figure 3:
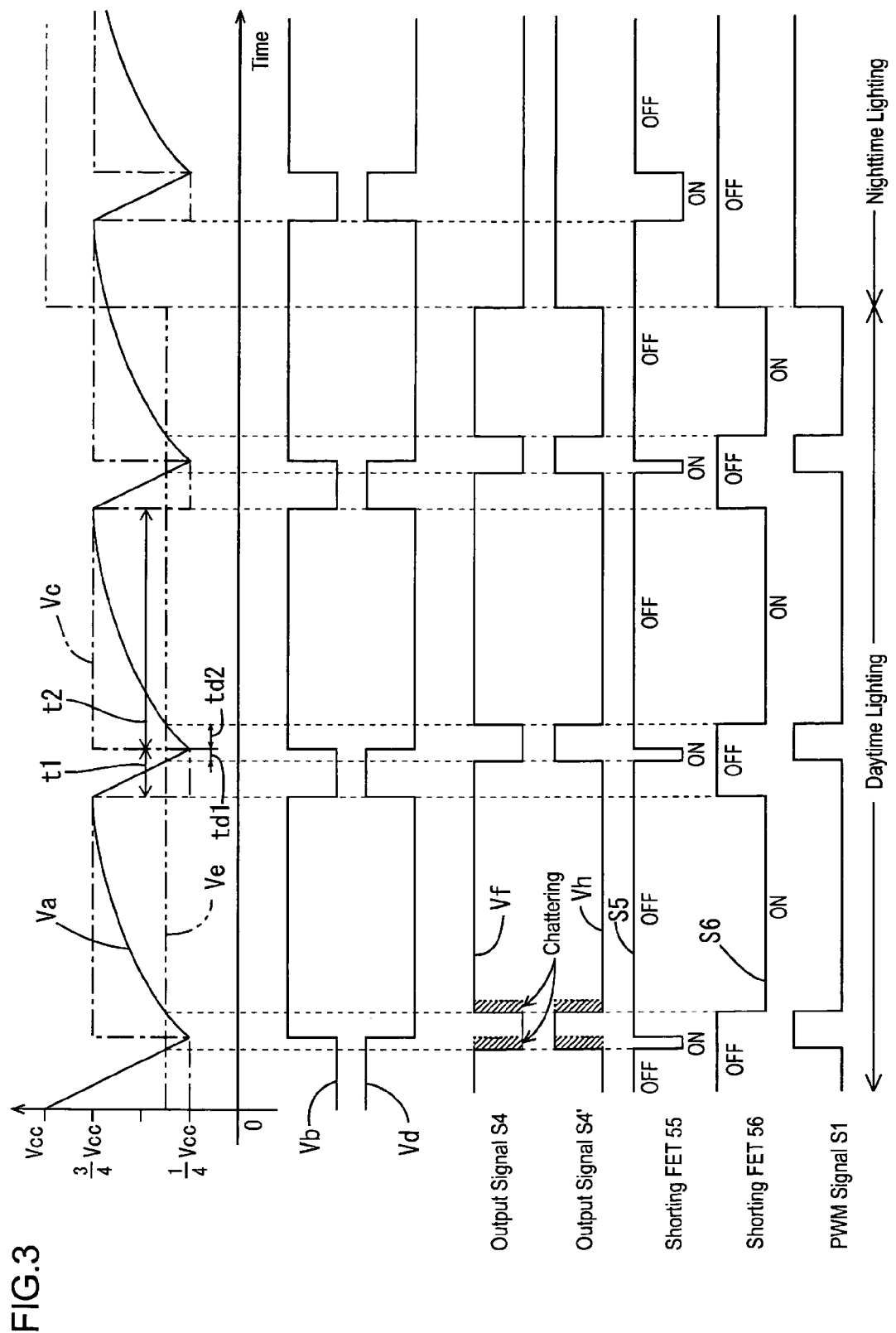
[FIG. 3] is a timing chart of an oscillator signal, a reference signal and voltage levels at various points.

The charging time t1 (shown in (the uppermost field of the timing chart of) FIG. 3) for the capacitor 21 can be determined by substituting "¼Vcc" for the voltage level Va in Formula 1.

Further, the charging current i1 is a mirror current of the current i2 passing through the second resistor R6. Therefore, the following formula 2 can be provided:

$$\begin{aligned} t1 &\approx C \cdot \left[\left(\tfrac{3}{4}Vcc\right) - \left(\tfrac{1}{4}Vcc\right)\right]/i1 \qquad \text{(Formula 2)} \\ &\approx C \cdot \left[\left(\tfrac{3}{4}Vcc\right) - \left(\tfrac{1}{4}Vcc\right)\right]/[(Vcc - Vt)/R'] \end{aligned}$$

when Vcc is much larger than Vt, $$\begin{aligned} t1 &\approx C \cdot \left[\left(\tfrac{3}{4}Vcc\right) - \left(\tfrac{1}{4}Vcc\right)\right]/[Vcc/R'] \\ &\approx 0.5 C \cdot R' \end{aligned}$$

where i1 is a value of the charging current, Vt is a gate-to-source voltage of the FET 26, and R' is the resistance value of the second resistor R6.

As can be seen, the charging time t12 is independent of fluctuation of the power supply voltage Vcc.

As seen in FIG. 5, the relationship of the voltage level Va at point "A" to time t during discharging of the capacitor 21 can be expressed by the following formula 3:

$$Vcc - Va = \tfrac{3}{4} Vcc \cdot e^{-\frac{1}{CR}t} \qquad \text{(Formula 3)}$$

where R is the resistance value of the first resistor R1, and C is the capacitance of the capacitor 21.

The discharging time t2 (shown in (the uppermost field of the timing chart of) FIG. 3) for the capacitor 21 can be determined by substituting "¾Vcc" for the voltage level Va in Formula 3.

Specifically, the discharging time t2 can be expressed by the following formula 4:

$$t2 = -CR \cdot \ln\left(\tfrac{1}{3}\right) \qquad \text{(Formula 4)}$$

As can be seen, the discharging time t2 as well as the charging time t1 is independent of fluctuation of the power supply voltage Vcc. That is, according to the present embodiment, an oscillator signal S2 can be generated with immunity from fluctuation of the power supply voltage Vcc, so that the ratio between the charging time and the discharging time is maintained constant. Further, the reference signal S3 varies depending on the power supply voltage Vcc, and consequently a PWM signal S1 of a predetermined duty ratio can be generated with immunity from fluctuation of the power supply voltage Vcc.

(2) Effect on Manufacturing Variations of the Semiconductor Device

Variation of the semiconductor device 70 due to manufacturing reasons cannot be prevented, and therefore the circuit elements of the semiconductor device 70 should have variation in characteristics. As seen from the above formulas, the charging time t1 is highly dependent on the characteristics of the elements such as the second resistor R6, while the discharging time t2 is highly dependent on the parallel circuit 27 (i.e., the first resistor R1 and the capacitor 21).

For this reason, in the present embodiment, the parallel circuit 27 is provided as an external circuit, in contrast to the other portions of the frequency control circuit 11. According to this construction, the charging time t1 depends on the characteristics of the circuit elements, which are provided in the package of the semiconductor device 70 and therefore subject to manufacturing variations of the semiconductor device 70. On the other hand, the discharging time t2 is almost independent of the circuit elements in the semiconductor device 70, but depends on the parallel circuit 27 (i.e., the first resistor R1 and the capacitor 21), which is provided external to the semiconductor device 70 and therefore can be selected to have appropriate characteristics after the semiconductor device 70 has been manufactured. As shown in (the uppermost field of the timing chart of) FIG. 3, the circuit constants of the circuits are set so that the discharging time t2 that depends on the device characteristics of the external parallel circuit 27 is longer than the charging time t1 that depends on the device characteristics of the internal circuits of the semiconductor device 70. According to this construction, the effects of manufacturing variation of the semiconductor device 70 on the duty ratio of a PWM signal S1 can be suppressed to the minimum, and a highly-accurate PWM signal S1 can be generated if the parallel circuit 27 having device characteristics appropriate for a desired duty ratio is selected after the semiconductor device 70 has been manufactured.

(3) Further, according to this construction, the oscillating frequency "f" and the like can be adjusted with high accuracy as follows. The oscillating frequency "f" of a PWM signal S1 can be expressed by the following formula 5:

$$f = \frac{1}{t1 + t2} \quad \text{(Formula 5)}$$

Formula 5 depends on the resistance value of the first resistor R1 and the capacitance of the capacitor 21. The first resistor R1 and the capacitor 21 are provided external to the semiconductor device 70. Therefore, the frequency can be set with high accuracy so as to be immune to manufacturing variations. Further, the oscillating frequency "f" of the PWM signal S1 can be set to an arbitrary value by adjusting the characteristics of the first resistor R1 and the capacitor 21.

(4) The time td1 (shown in (the uppermost field of the timing chart of) FIG. 3) until charging of the capacitor 21 suspends after the voltage level Va falls below the level of the reference signal S3 (i.e., the voltage level Ve1 at the connection E) during the charging of the capacitor 21 can be calculated by subtracting the time, which is determined by substituting "Ve1" for the voltage level Va in Formula 1, from the charging time t1.

On the other hand, the time td2 (shown in (the uppermost field of the timing chart of) FIG. 3) until the voltage level Va exceeds the level of the reference signal S3 (i.e., the voltage level Ve1 at the connection E) after the start of discharging of the capacitor 21 can be calculated by substituting "Ve1" for the voltage level Va in Formula 2.

The duty ratio "Duty" of a PWM signal S1 can be expressed by the following formula 6:

$$\text{Duty} = \frac{td1 + td2}{t1 + t2} \quad \text{(Formula 6)}$$

In the present embodiment, the switching circuit 12 for setting the level of the reference signal S3 is provided external to the semiconductor device 70. Thereby, the duty ratio can be set with high accuracy so as to be immune to manufacturing variations, if the voltage-dividing resistors R7, R8, and the like, of the switching circuit 12 are selected to have characteristics appropriate for a desired duty ratio. Further, the duty ratio of the PWM signal S1 can be set to an arbitrary value by adjusting the characteristics of the voltage-dividing resistors R7, R8 and the like.

(5) According to the present embodiment, after the output signal S4 (and also the output signal S4') are level-inverted, the inverted state thereof is maintained by the first and second shorting FETs 55, 56 provided as a level-inversion inhibiting circuit. Thereafter the inhibition of level-inversion is automatically released, when the changing trend of the oscillator signal S2 inverts. Thereby chattering can be prevented, even if the level of the reference signal S3 fluctuates due to a noise or the like during vehicle acceleration, for example. Further, according to the present embodiment, in contrast to a conventional construction utilizing a hysteresis comparator, the level of the reference signal S3 is determined mainly depending upon the voltage-dividing resistors R7, R8 provided in the switching circuit 12, that is, substantially not affected by the resistor components in the comparator 50. The voltage-dividing resistors R7, R8 are provided as external resistors, and therefore those having appropriate resistance values can be selected even after the PWM signal generator 10 has been manufactured. Consequently, a PWM signal S1 having a stable duty ratio can be generated, even if circuit constants have variations due to manufacturing reasons (See FIG. 3 (the lowermost field of the timing chart)).

(6) The NAND circuit 58 detects when the changing trend of the oscillator signal S2 inverts after the level of the oscillator signal S2 falls below the level of the reference signal S3, and releases the shorting operation of the first shorting FET 55 at the time of the detection. That is, inhibition of level-inversion is released then. On the other hand, the NAND circuit 59 detects when the changing trend of the oscillator signal S2 inverts after the level of the oscillator signal S2 exceeds the level of the reference signal S3, and releases the shorting operation of the second shorting FET 56 at the time of the detection. That is, inhibition of level-inversion is released then. Thus, release of inhibition of level-inversion can be achieved without using a timer or the like.

Other Embodiments

The present invention is not limited to the embodiment explained in the above description made with reference to the drawings. The following embodiments may be included in the technical scope of the present invention, for example, and further the present invention may be embodied in various forms without departing from the scope of the invention.

(1) In the above embodiment, the switching element and the semiconductor switching element, which are connected to the power source and the load, may be provided in the semiconductor device 70, or alternatively outside thereof.

(2) The above FETs 23-26, 51-56 maybe bipolar transistors.

(3) The transistors 30, 31 may be unipolar transistors such as FETs.

(4) The level-inversion inhibiting circuit may have a construction, for example, in which the level of the reference signal S3 or the level of the oscillator signal S2 applied to the comparator 50 is forcibly pulled up or pulled down, instead of the construction according to the above embodiment.

(5) In the above embodiment, the comparator 50 is used as a comparator circuit. However, the present invention is not limited to this construction. An operational amplifier can be used instead. In this case, the respective shorting switching elements can be connected in parallel to a pair of switching elements constituting a push-pull circuit of the operational amplifier.

(6) In the above embodiment, a pull-down type oscillator circuit (which outputs an oscillator signal based on the potential of the lower potential terminal of the capacitor 21) is used. However, a pull-up type oscillator circuit (which outputs an oscillator signal based on the potential of the higher potential terminal of the capacitor 21) can be used instead. In the case of the pull-down type like the above embodiment wherein a reference signal is generated based on the lower potential side of the oscillating range, there is an advantage of a shorter time period of the possibility of chattering, because the waveform of the oscillator signal is precipitous as for that side.

The invention claimed is:

1. A power supply controller disposed between a power source and a load for controlling power supply from said power source to said load, said power supply controller comprising:
   a semiconductor switching element disposed on a current supply line connected between said power source and said load; and
   a PWM signal generator including an oscillator circuit for outputting an oscillator signal, and further including a comparator circuit for receiving said oscillator signal and a reference signal and outputting an output signal that is level-inverted according to a magnitude relation between a level of said oscillator signal and a level of said reference signal, said PWM signal generator being configured to provide an output signal of a pulse train from said comparator circuit, as a PWM signal for pulse width modulation control, to said semiconductor switching element in order to cause ON/OFF operation, wherein said oscillator circuit includes:
   a parallel circuit having a first resistive element and a capacitor which are arranged parallel to each other;
   a first switching element disposed on a path of a charging current for charging said capacitor;
   a charge/discharge control circuit for turning said first switching element from ON to OFF when a charging voltage for said capacitor reaches a first voltage that changes depending on a power supply voltage of said power source, and for turning said first switching element from OFF to ON when said charging voltage is the same as a second voltage that changes depending on said power supply voltage; and
   a current changing circuit for changing said charging current depending on said power supply voltage.

2. A power supply controller as in claim 1, further comprising a reference signal setting circuit for outputting said reference signal, wherein a level of said reference signal changes depending on said power supply voltage.

3. A power supply controller as in claim 2, wherein said reference signal setting circuit includes a second switching element, and a switching circuit for switching a level of said reference signal between a first level in an amplitude range of said oscillator signal and a second level outside of the amplitude range of said oscillator signal based on an ON/OFF operation of said second switching element.

4. A power supply controller as in claim 1, wherein:
   said current changing circuit includes a second resistive element connected to said power source, and further includes a current mirror circuit to which a current passing through said second resistive element passes; and
   said capacitor is charged by a mirror current generated by said current mirror circuit.

5. A power supply controller as in claim 1, wherein:
   circuits of said PWM signal generator except for said parallel circuit are configured onto at least one of a single chip or a plurality of chips housed in a package so as to form a semiconductor device, and said parallel circuit is disposed outside of said semiconductor device and connected to the circuits other than said parallel circuit via a first external terminal of said semiconductor device; and
   a discharging time for said capacitor based on turn-off of said first switching element is set to be longer than a charging time for said capacitor which is based on turn-on of said first switching element.

6. A power supply controller as in claim 5, further comprising a reference signal setting circuit for outputting said reference signal, wherein said reference signal setting circuit is disposed outside of said semiconductor device and connected to the circuits other than said parallel circuit via a second external terminal of said semiconductor device.

7. A power supply controller as in claim 5, wherein said semiconductor device includes said semiconductor switch element and a protective circuit for causing a shutoff operation of said semiconductor switch element based on detection of an anomaly of a current passing through said semiconductor switch element, which are configured onto at least one of a single chip or a plurality of chips placed in a package.

8. A power supply controller disposed between a power source and a load for controlling power supply from said power source to said load, said power supply controller comprising:
   a semiconductor switching element disposed on a current supply line connected between said power source and said load; and
   a PWM signal generator including an oscillator circuit for outputting an oscillator signal, and further including a comparator circuit for receiving said oscillator signal and a reference signal and outputting an output signal that is level-inverted according to a magnitude relation between a level of said oscillator signal and a level of said reference signal, said PWM signal generator being configured to provide an output signal of a pulse train from said comparator circuit, as a PWM signal for pulse width modulation control, to said semiconductor switching element in order to cause an ON/OFF operation, wherein:
   said oscillator circuit includes a parallel circuit having a first resistive element and a capacitor which are arranged parallel to each other;
   a first switching element disposed on a path of a charging current for charging said capacitor; and
   a charge/discharge control circuit for turning said first switching element from ON to OFF when a charging voltage for said capacitor reaches a first voltage, and for turning said first switching element from OFF to ON when said charging voltage is the same as a second voltage, said oscillator circuit being configured to output an oscillator signal based on said charging voltage;
   circuits of said PWM signal generator except for said parallel circuit are configured onto at least one of a single chip or a plurality of chips housed in a package so as to form a semiconductor device, and said parallel circuit is disposed outside of said semiconductor device and connected to the circuits other than said parallel circuit via a first external terminal of said semiconductor device; and a discharging time for said capacitor based on turn-off of said first switching element is set to be longer than a charging time for said capacitor which is based on turn-on of said first switching element.

9. A power supply controller as in claim 8, further comprising a reference signal setting circuit for outputting said reference signal, wherein said reference signal setting circuit is disposed outside of said semiconductor device and connected to the circuits other than said parallel circuit via a second external terminal of said semiconductor device.

10. A power supply controller as in claim 9, wherein said reference signal setting circuit includes a second switching element, and a switching circuit for switching a level of said reference signal between a first level in an amplitude range of said oscillator signal and a second level out of the amplitude range of said oscillator signal based on an ON/OFF operation of said second switching element.

11. A power supply controller as in claim 8, wherein said semiconductor device includes said semiconductor switch element and a protective circuit for causing a shutoff operation of said semiconductor switch element based on detection of an anomaly of a current passing through said semiconductor switch element, which are configured onto at least one of a single chip or a plurality of chips housed in a package.

* * * * *